United States Patent
Gautama

(10) Patent No.: US 9,607,628 B2
(45) Date of Patent: Mar. 28, 2017

(54) AUDIO SYSTEM

(71) Applicant: NXP B.V., Eindhoven (NL)

(72) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/855,094

(22) Filed: Sep. 15, 2015

(65) Prior Publication Data

US 2016/0111110 A1    Apr. 21, 2016

(30) Foreign Application Priority Data

Oct. 15, 2014  (EP) .................................... 14188934

(51) Int. Cl.
| | | |
|---|---|---|
| *G10L 21/0316* | (2013.01) | |
| *H03G 3/20* | (2006.01) | |
| *H04R 3/04* | (2006.01) | |
| *H04R 3/00* | (2006.01) | |

(52) U.S. Cl.
CPC ........... *G10L 21/0316* (2013.01); *H03G 3/20* (2013.01); *H04R 3/04* (2013.01); *H04R 3/002* (2013.01)

(58) Field of Classification Search
CPC .............................. G10L 21/0316; H03G 3/20
USPC .... 330/289, 149; 375/297, 296; 379/406.06, 379/406.08; 381/55, 59, 66, 94.3, 96, 381/111, 58, 71.1, 71.6, 97, 98, 99, 107, 381/119; 704/200.1; 327/317; 348/474; 455/114.3

See application file for complete search history.

(56) References Cited

U.S. PATENT DOCUMENTS

| | | | | | |
|---|---|---|---|---|---|
| 5,185,801 | A | * | 2/1993 | Meyer ...................... | H04R 3/04 381/59 |
| 5,438,625 | A | * | 8/1995 | Klippel .................. | H04R 3/002 381/59 |
| 5,473,282 | A | * | 12/1995 | Janssens ................... | H03F 1/52 330/289 |
| 5,528,695 | A | | 6/1996 | Klippel | |
| 5,600,718 | A | * | 2/1997 | Dent ...................... | H04R 3/002 379/400 |
| 5,680,450 | A | * | 10/1997 | Dent .................... | H04M 9/082 379/388.02 |

(Continued)

OTHER PUBLICATIONS

Kaizer, A. J. M. "Modeling of Nonlinear Response of an Electrodynamic Loudspeaker by a Volterra Series Expansion", J. Audio Eng. Soc., vol. 35, pp. 421-433 (1987).

(Continued)

*Primary Examiner* — Gerald Gauthier
(74) *Attorney, Agent, or Firm* — Rajeev Madnawat

(57) ABSTRACT

An audio system is described including an audio processor, an amplifier and a speaker and a distortion estimator. The distortion estimator calculates at least one of an expected response of the amplifier to an audio signal and an expected response of the loudspeaker to an audio signal. The distortion estimator is operable to generate a distortion prediction signal determined by a difference between an expected non-linear response of at least one of the loudspeaker and the amplifier and an expected linear response of at least one of the loudspeaker and the amplifier. A controller coupled to the audio processor and a control input of the audio processor may vary the operating parameters of the audio processor depending on the estimated distortion.

15 Claims, 4 Drawing Sheets

(56) References Cited

U.S. PATENT DOCUMENTS

| | | | | |
|---|---|---|---|---|
| 5,815,585 | A * | 9/1998 | Klippel | H03H 21/0001 381/59 |
| 6,201,873 | B1 | 3/2001 | Dal Farra | |
| 6,798,843 | B1 * | 9/2004 | Wright | H03F 1/3241 330/149 |
| 7,366,252 | B2 * | 4/2008 | Cova | H03F 1/3247 375/296 |
| 7,372,966 | B2 * | 5/2008 | Bright | H04R 3/007 381/55 |
| 7,826,625 | B2 * | 11/2010 | Lashkari | H04R 3/04 381/103 |
| 7,873,172 | B2 * | 1/2011 | Lashkari | H03F 1/3264 381/59 |
| 8,078,433 | B2 | 12/2011 | Klippel | |
| 8,194,869 | B2 * | 6/2012 | Mihelich | H04R 3/002 381/58 |
| 8,351,877 | B2 * | 1/2013 | Kim | H03F 1/3247 303/149 |
| 8,577,047 | B2 * | 11/2013 | Gautama | H04R 3/007 381/104 |
| 9,014,380 | B2 * | 4/2015 | Gautama | H04R 3/002 330/145 |
| 9,331,650 | B2 * | 5/2016 | Gautama | H03G 3/00 |
| 2002/0085647 | A1 * | 7/2002 | Oishi | H03F 1/3247 375/297 |
| 2003/0112370 | A1 * | 6/2003 | Long | H04N 7/08 348/474 |
| 2004/0086140 | A1 * | 5/2004 | Fedigan | H04R 3/00 381/96 |
| 2006/0274904 | A1 | 12/2006 | Lashkari | |
| 2007/0160221 | A1 * | 7/2007 | Pfaffinger | H04R 29/001 381/59 |
| 2008/0037804 | A1 | 2/2008 | Shmunk | |
| 2008/0129379 | A1 * | 6/2008 | Copeland | H03F 1/3241 330/149 |
| 2011/0085678 | A1 | 4/2011 | Pfaffinger | |
| 2011/0150233 | A1 * | 6/2011 | Gautama | G10K 11/1782 381/71.6 |
| 2011/0194705 | A1 * | 8/2011 | Gautama | H03F 1/30 381/59 |
| 2012/0119811 | A1 * | 5/2012 | Bai | H03F 1/3252 327/317 |
| 2012/0119832 | A1 * | 5/2012 | Bai | H03F 1/3247 330/149 |
| 2012/0121098 | A1 * | 5/2012 | Gautama | H04R 3/007 381/59 |
| 2012/0179456 | A1 * | 7/2012 | Ryu | H04R 3/007 704/200.1 |
| 2012/0281844 | A1 * | 11/2012 | Luo | H03F 1/52 381/55 |
| 2012/0288118 | A1 * | 11/2012 | Gautama | H04R 3/007 381/98 |
| 2012/0328113 | A1 * | 12/2012 | Gautama | H04R 29/003 381/55 |
| 2012/0328117 | A1 * | 12/2012 | Gautama | H03F 1/52 381/59 |
| 2013/0022208 | A1 * | 1/2013 | Dhuyvetter | H03G 11/002 381/55 |
| 2013/0077795 | A1 * | 3/2013 | Risbo | H04R 29/003 381/55 |
| 2013/0251164 | A1 * | 9/2013 | Gautama | H04R 29/001 381/59 |
| 2013/0251167 | A1 * | 9/2013 | Gautama | H04R 3/007 381/66 |
| 2014/0064502 | A1 * | 3/2014 | Hoang Co Thuy | H04R 29/003 381/59 |
| 2014/0072132 | A1 * | 3/2014 | Gautama | H03G 3/345 381/71.1 |
| 2014/0146981 | A1 * | 5/2014 | Gautama | H03G 3/00 381/107 |
| 2015/0131806 | A1 * | 5/2015 | Gautama | H04R 29/001 381/59 |
| 2015/0146875 | A1 * | 5/2015 | Gautama | H04R 3/007 381/58 |
| 2015/0170670 | A1 * | 6/2015 | Luyten | G10L 21/04 381/97 |
| 2015/0181318 | A1 * | 6/2015 | Gautama | H04R 1/00 381/59 |
| 2015/0371620 | A1 * | 12/2015 | Gautama | G10H 1/18 381/119 |
| 2016/0014486 | A1 * | 1/2016 | Macours | H04R 1/02 381/111 |
| 2016/0050489 | A1 * | 2/2016 | Lashkari | H04M 9/08 381/66 |
| 2016/0105742 | A1 * | 4/2016 | Gautama | H03G 3/20 381/99 |
| 2016/0111110 | A1 * | 4/2016 | Gautama | G10L 21/0316 381/94.3 |
| 2016/0269128 | A1 * | 9/2016 | Gautama | H04B 11/00 |
| 2016/0322949 | A1 * | 11/2016 | Gautama | H03G 9/005 |
| 2016/0352915 | A1 * | 12/2016 | Gautama | H04M 9/082 |

OTHER PUBLICATIONS

Klippel, W. Auralization of Signal Distortion in Audio Systems Part 2: Transducer Modeling, AES Conv. 136, 8 pgs. (Apr. 2014).

Klippel, W. "Active Compensation of Transducer Nonlinearities", Audio Eng. Soc. Conf. 23rd Intl. Conf.: Signal Processing in Audio Recording and Reproduction (May 2003).

Klippel, W. Loudspeaker Nonlinearities—Causes, Parameters, Symptoms, J. Audio Eng. Soc. 54, vol. 10, pp. 907-939 (2006).

Extended European Search Report for EP Patent Appln. No. 14188934.5 (Apr. 15, 2015).

* cited by examiner

4000

AUDIO SYSTEM

CROSS-REFERENCE TO RELATED APPLICATIONS

This application claims the priority under 35 U.S.C. §119 of European patent application no. 14188934.5, filed on Oct. 15, 2014, the contents of which are incorporated by reference herein.

This invention relates to an audio system.

Audio systems may typically produce distortion caused by non-linearities due, for example, to the loudspeaker or the amplifier. This distortion may affect the quality of the audio experienced by the user. In particular audio systems used in vehicles and mobile devices such as mobile phones, tablets and laptop PCs which use smaller speakers may have worse distortion. In one approach to compensate for non-linearities, a loudspeaker model is used to pre-distort an input signal to effectively linearise the response of the system thus reducing the amount of distortion. This requires a sufficiently accurate nonlinear model of the loudspeaker to be obtained within the appropriate displacement working range. Although the nonlinear loudspeaker models fit well to the measured data and can predict the loudspeaker behaviour for moderate diaphragm displacements, it is difficult to predict the behaviour for large displacements.

In another approach, an audio system may limit the input voltage such that its frequency magnitude components are below a maximum voltage leading to just acceptable distortion. These maximum voltages are preferably measured by applying a sine wave for a given frequency to the loudspeaker and measuring the maximum amplitude of the voltage that can be applied immediately prior to the onset of just acceptable distortion at that frequency. From this curve, a transfer function can be derived that is similar to the voltage-to-displacement transfer function of a loudspeaker. This approach will correctly predict the distortion that is generated for a single sine wave, but cannot accurately predict the distortion in the general case, since the superposition principle does not hold for a nonlinear system: when two sine waves are applied, sum and difference frequencies are generated by a nonlinear system that are not present when the sine waves are applied separately. Hence, the system will not limit the distortion in the general case.

Various aspects of the invention are defined in the accompanying claims. In a first aspect there is defined an audio system comprising an audio processor for receiving an audio input signal and outputting an audio output signal; an amplifier coupled to the audio processor; a loudspeaker coupled to the amplifier; a distortion estimator configured and arranged to determine an expected response of the amplifier and/or the loudspeaker to at least one of the audio input signal and the audio output signal; a controller coupled to the distortion estimator and the audio processor; wherein the distortion estimator is operable to generate a distortion prediction signal in dependence of a difference between an expected non-linear response of the loudspeaker and/or the amplifier and an expected linear response of the loudspeaker and/or the amplifier; and wherein the controller is configured and arranged to vary the operating parameters of the audio processor in dependence of the generated distortion prediction signal.

The audio system may improve the perceived audio quality by limiting the distortion that is generated in the output of a loudspeaker, originating from the loudspeaker itself and possibly also the amplifier. The processing that is applied to the input signal is controlled on the basis of measures or estimates of the distortion that is present in the output, rather than from a signal that is related to the instantaneous load of the loudspeaker, such as for example diaphragm displacement. A loudspeaker may be any transducer that converts electrical energy into acoustical energy.

Unlike the pre-distortion approach, the audio system may allow the use of simpler models to estimate the response of a loudspeaker since the audio system is less sensitive to the accuracy of the loudspeaker model. The pre-distortion approach determines for a given input signal, the appropriate pre-distorted input signal that generates the desired output signal, that is to say, a linear version of the original input from the nonlinear loudspeaker. The pre-distortion approach requires a very accurate nonlinear model, and the performance of such an approach depends heavily on the accuracy of the model. The audio system requires an estimation of the distortion level that is expected, and, for instance, does not require the prediction of the nonlinear distortion to be phase accurate.

In embodiments, the operating parameters may comprise at least one of a gain, a compression threshold and a compression ratio.

One or more of the operating parameters of the audio processor may be varied dependent on the estimated distortion. For example, if the distortion level estimate is high, the gain may be reduced, the compression threshold may be reduced and the compression ratio may be increased.

In embodiments, the controller may comprise a perceptual weighting model and the controller may be operable to assign a lower weighting factor to frequency components of the distortion prediction signal that are of lower perceptual relevance.

In embodiments, the perceptual weighting model may comprise an A-weighting model.

The controller may comprise an A-weighting model or function whereby distortions at very high frequencies, for example above 10 kHz, are not relevant and also distortions at very low frequencies for example less than 30 Hz are not relevant. This is because the human ear is not sensitive to these frequencies and therefore any distortion at these frequencies will not result in a perceived reduction in the audio quality.

The controller may comprise a masking model, whereby if the distortion at a particular frequency is masked by an undistorted frequency component, this may also be ignored if there is no perceived loss of audio quality. This may occur for example when a large undistorted frequency component is present at frequency very close to a small distorted frequency component for example within 100 hertz for an undistorted frequency component at 1000 hertz. In this case no processing of the input signal is required to remove the distortion component.

In embodiments the distortion estimator may comprise a linear loudspeaker response estimator and a non-linear loudspeaker response estimator and a comparator coupled to the output of the linear loudspeaker response estimator and the non-linear loudspeaker response estimator and wherein the comparator is operable to output a difference in output between the estimated linear loudspeaker response and the estimated non-linear loudspeaker model.

In embodiments the audio processor may be configured to apply a time-varying gain to an audio signal and the controller is operable to determine a temporally averaged distortion prediction signal value and to vary the time-varying gain in dependence of the temporally averaged distortion prediction signal value.

In embodiments the audio processor may comprise a multi-band processor and wherein the controller is operable to apply different gains to different frequency bands.

In embodiments the audio processor may comprise a dynamic range controller.

In embodiments, the audio processor may comprise a microphone coupled the audio distortion estimator and wherein the audio distortion estimator is operable to adapt the expected response of at least one of the loudspeaker and the amplifier in response to an acoustic input.

In embodiments, the audio system may comprise a current sensor coupled to the loudspeaker and the distortion estimator and wherein the distortion estimator is operable to adapt the expected linear and non-linear response of the loudspeaker in dependence on the current flowing through the coil of the loudspeaker.

In embodiments the distortion estimator may be configured to generate the distortion prediction signal in dependence of a difference between the expected non-linear response of the loudspeaker and the amplifier and the expected linear response of the loudspeaker and the amplifier; and wherein the audio processor is configured and arranged to vary the operating parameters of the audio processor in dependence of the generated distortion prediction signal.

In embodiments the distortion estimator may be configured and arranged to generate a further distortion prediction signal in dependence of a difference between the predicted linear response of the loudspeaker to the audio input signal and the predicted linear response of the loudspeaker to the audio output signal; and the controller is configured and arranged to vary the operating parameters of the audio processor in dependence of the generated distortion prediction signal and the further distortion prediction signal.

The further distortion signal is related to the distortion that is caused by the processing performed in the audio processor when it would be reproduced by the amplifier and loudspeaker in the absence of additional nonlinearities from the amplifier and loudspeaker. The controller may adapt the processing parameters such that the predicted contribution of the audio processor to the distortion is the same as that of the amplifier and/or loudspeaker. Alternatively the controller may adapt the processing parameters to achieve a predetermined fixed ratio between the predicted distortion contributed by the audio processor and the distortion contributed by the amplifier and/or loudspeaker.

In embodiments the controller may be further operable to determine a temporal average of the distortion prediction signal level and the further distortion prediction signal level and to vary the operating parameters of the audio processor in dependence of the temporal average of the distortion prediction signal level and the temporal average of the further distortion prediction signal level.

The controller may be configured and arranged to compare a temporal average of the distortion prediction signal level and the further distortion prediction signal level and to vary the operating parameters of the audio processor in dependence of the comparison.

In embodiments the controller may be configured and arranged to reduce the dynamic range threshold of the audio processor when the temporal average of the further distortion signal is greater than the temporal average of the distortion signal.

In embodiments the audio processor may be configured to apply a domain transform to the audio input signal prior to processing the signal and to apply an inverse domain transform prior to outputting the audio signal.

The audio processor may transform the input signal into another domain for processing, such as for example the frequency domain using a fast fourier transform.

Embodiments of the audio system may be included in a mobile device such as a mobile phone, tablet PC or laptop PC. Embodiments of the audio system may be included in a motor vehicle.

In the figures and description like reference numerals refer to like features. Embodiments of the invention are now described in detail, by way of example only, illustrated by the accompanying drawings in which.

Figure 1:
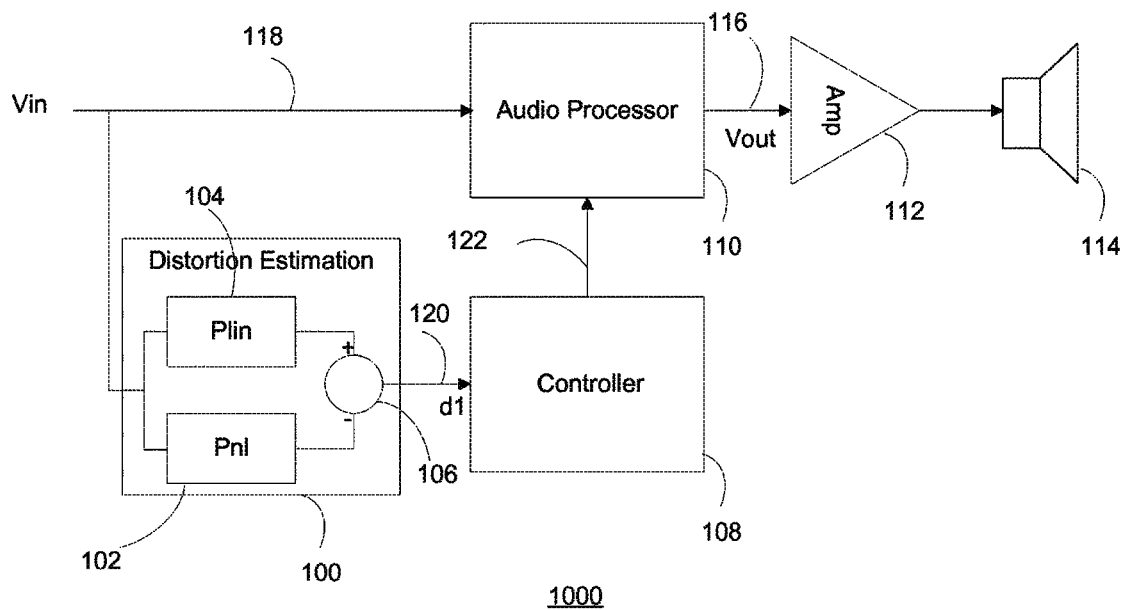
FIG. 1 shows an audio system with a feed-forward control loop according to an embodiment.

FIG. 1 shows an audio system 1000. A distortion estimator 100 may have a nonlinear response estimator 102 and a linear response estimator 104. The input of nonlinear response estimator 102 may be connected to an audio input 118. The input of linear response estimator 104 may be connected to an audio input 118. The output of nonlinear response estimator 102 may be connected to a difference module 106. The output of linear response estimator 104 may be connected to the difference module 106. The output 120 of difference module 106 may be connected to the input of controller 108. Controller output 122 may be connected to a control input of the audio processor 110. The audio processor 110 may be connected to the audio input 118. The audio processor output 116 may be connected to an amplifier 112 which may be an audio amplifier such as a class D amplifier. An output of the amplifier 112 may be connected to a loudspeaker 114.

The audio system 1000 of FIG. 1 has a feed-forward control mechanism and operates as follows. An input signal Vin on audio input 118 may be processed by audio processor 110. The input signal Vin may also be routed to the distortion estimator 100. The distortion estimator 100 may estimate a linear response of the amplifier 112 and a loudspeaker 114. A linear response of an amplifier may be estimated by a linear gain model. A linear response of the loudspeaker 114 may be modelled by the linear terms in a Volterra series, or from a parametric linear model of the loudspeaker behaviour. The distortion estimator may estimate a non-linear response of the amplifier 112 and the loudspeaker 114 to the audio input signal Vin. The non-linear response estimator 102 may estimate a non-linear response of an amplifier using a clipping amplifier model. The non-linear response estimator 102 may estimate a non-linear response of the loudspeaker 114 using a Volterra series having linear and non-linear terms, or from a parametric non-linear model of the loudspeaker behaviour. The difference module 16 may subtract the non-linear estimation output from the non-linear response estimator 102 from the linear estimation output from the linear response estimator 104 or vice versa. The output of the difference module 106 may be a time varying distortion signal D1 which represents an estimate of the amount of distortion in the amplifier 112 and the loudspeaker 114.

Figure 2:
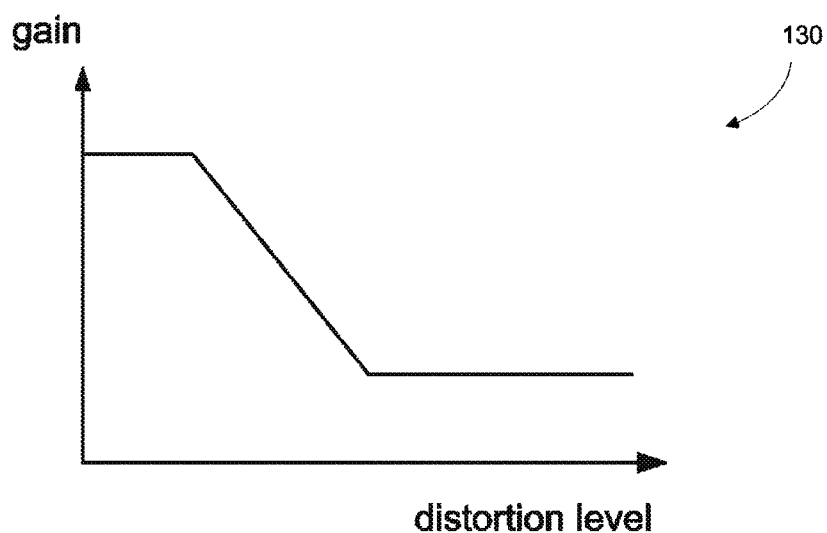
FIG. 2 illustrates a graph of a required gain versus the measurement of distortion level according to an example control method.

The controller 108 may vary one or more parameters dependent on the value of the time varying distortion signal D1. The audio processor 110 may be a dynamic range controller (DRC). The parameters may be varied may include the gain value, the threshold value for DRC processing, and the compression ratio to be applied to an audio signal. An example of how the gain may be varied dependent on a predicted distortion level is shown in FIG. 2. Graph 130 has a y-axis of the required gain versus and x-axis of the predicted distortion level. The predicted distortion level may be the temporally averaged signal energy of signal D1. At low distortion levels the gain may be a constant value, for example −20 dB. Above a certain threshold value of predicted distortion level, the gain may decrease linearly to a minimum gain value. In an example audio system for a car entertainment system, a typical gain value may be −20 dB and a distortion level may be −20 dB. The gain value that is applied to the audio processor 110 by the controller 108 may be a smoothed or averaged version of the instantaneous required gain value.

The distortion estimator 100 may only estimate the distortion due to the amplifier 112. In other examples the distortion estimator may only estimate the distortion due to the loudspeaker 114. In some example embodiments, the distortion signal D1 may be determined directly from the input signal such as when the loudspeaker 114 is approximated using a Volterra series. The skilled person will appreciate that a truncated Volterra series expansion of a system model consists of the superposition of a number of linear terms and a number of higher-order terms. The distortion signal D1 can therefore be directly determined as the contribution of the higher-order, non-linear terms. In this case a separate linear response estimator 104, non-linear response estimator 102, and the difference module 106 may be omitted.

The audio processor 110 may apply different gains in different frequency bands. The different gains may be determined by the controller 108. For the loudspeaker 114, the audio input signal Vin may be split into an upper frequency band and a lower frequency band. The controller 108 may apply more attenuation to the lower frequency band than to the upper frequency band. This is because much of the distortion in the loudspeaker 14 may be caused by diaphragm displacement, and the displacement may decrease for frequencies exceeding the loudspeaker resonant frequency. For an automotive audio system the loudspeaker resonant frequency may be in the range of 50 Hz to 150 Hz. For a mobile device to the loudspeaker resonant frequency may be in the range of 400 Hz to 1000 Hz.

The audio processor 110 may include a forward and backward transform to a different domain or representation, such as the frequency domain using a Fast Fourier Transform. The input signal 118 is then transformed, the audio processing is performed in the different domain or representation, and the result is transformed to the time domain.

The controller 108 may also apply a perceptual weighting to the distortion estimation signal D1. This may be for example an A-weighting function whereby distortions at very high frequencies, for example above 10 kHz, are not relevant and also distortions have very low frequencies for example less than 30 Hz are not relevant.

The audio system 1000 may be implemented by a combination of hardware logic circuitry, analog circuitry and software running on a processor which may for example be a digital signal processor. For example, the audio processor 110 controller 108 and the distortion estimator 100 may be implemented as software modules executed on a digital signal processor. The audio input signal may be a digital signal. The output from the audio processor 116 may be a digital output. The amplifier 112 may include a digital to analog convertor. The difference module 106 may be a comparator.

Figure 3:
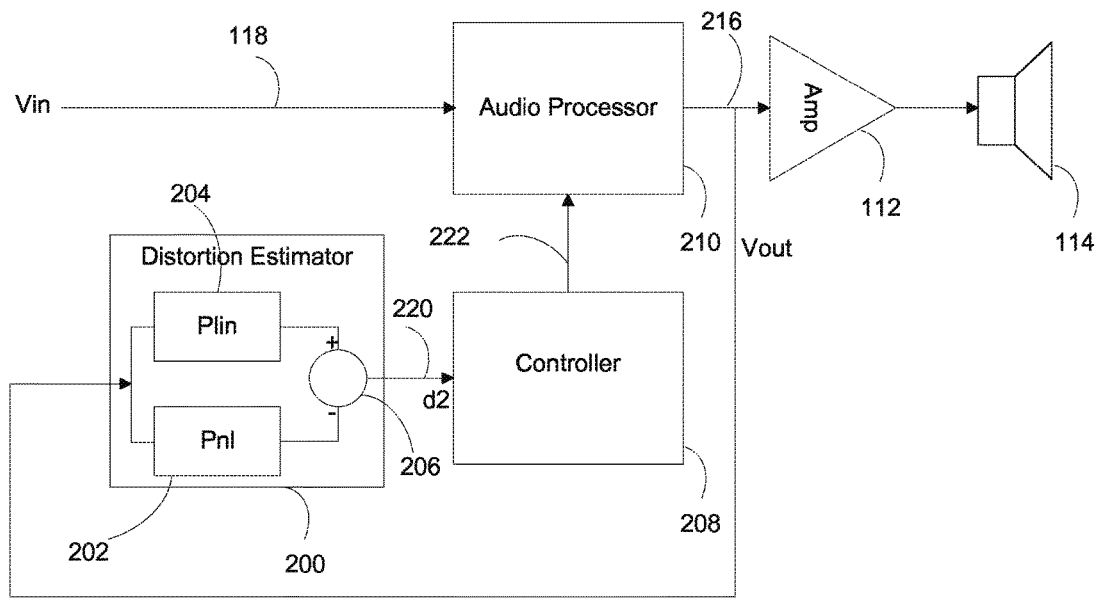
FIG. 3 shows an audio system with a feedback control loop according to an embodiment.

FIG. 3 shows an audio system 2000 having a feedback control configuration. A distortion estimator 200 may have a nonlinear response estimator 202 and a linear response estimator 204. The input of nonlinear response estimator 202 may be connected to an audio processor output 216. The input of linear response estimator 204 may be connected to an audio processor output 216. The output of nonlinear response estimator 202 may be connected to a difference module 206. The output of linear response estimator 204 is connected to the difference module 206. The output 220 of difference module 206 may be connected to the input of controller 208. Controller output 222 may be connected to a control input of the audio processor 210. The audio processor 210 may be connected to the audio input 118. The audio processor output 216 may be connected to an amplifier 112 which may be an audio amplifier such as a class D amplifier. An output of the amplifier 112 may be connected to a loudspeaker 114.

The audio system 2000 of FIG. 3 has a feed-back control mechanism and operates as follows. An input signal Vin on audio input 118 may be processed by audio processor 210. The input signal Vin may be a digital signal. The audio processor 210 may generate an output signal Vout on audio processor output 216. The output signal Vout which may be a digital signal, may also be routed to the distortion estimator 200. The distortion estimator 200 may include a linear response estimator 204 which may estimate a linear response of the amplifier 112 and a loudspeaker 114. The linear response estimator 204 may estimate the linear response of an amplifier using a non-clipping model of an amplifier such as a linear gain model. The linear response estimator 204 may estimate a linear response of the loudspeaker 114 by the linear terms in a truncated Volterra series, or from a parametric linear model of the loudspeaker behaviour. The output of the linear response estimator 204 may be a signal that characterises the predicted output of the loudspeaker 114 as an expected diaphragm displacement. The output of the linear response estimator 204 may be a signal that characterises the predicted output of the loudspeaker 114 as an expected acoustic output.

The distortion estimator may estimate a non-linear response of the amplifier 112 and the loudspeaker and 14 to the audio output signal Vout. The non-linear response estimator 202 may estimate a non-linear response of an amplifier using a clipping amplifier model. The non-linear response estimator 202 may estimate a non-linear response of the loudspeaker 114 using a Volterra series having linear and nonlinear terms, or from a parametric non-linear model of the loudspeaker behaviour. The output of the non-linear response estimator 202 may be a signal that characterises the predicted output of the loudspeaker 114 as an expected diaphragm displacement. Alternatively or in addition, the output of the non-linear response estimator 202 may be a signal that characterises the predicted output of the loudspeaker 114 as an expected acoustical output. The difference module 206 may determine a difference between the non-linear estimation output from the non-linear response estimator 202 and the linear response estimation output from the linear response estimator 204. The output of the difference module 206 may be a time varying distortion signal D2 which represents an estimate of the amount of distortion in the amplifier 112 and the loudspeaker 114 caused by the output signal Vout.

The controller 208 may vary one or more parameters dependent on the value of the time varying distortion signal D2. For example when the distortion signal D2 increases in power, the processing may be adapted such that the expected diaphragm displacement of the loudspeaker 114 decreases. The audio processor 210 may be a dynamic range controller (DRC). The expected diaphragm displacement of the loudspeaker 114 may be decreased by for example lowering the DRC threshold value such that the audio processor compresses the signal at lower input signal levels. Alternatively, or in addition the expected diaphragm displacement of the loudspeaker 114 may be decreased by reducing the gain of the audio processor 210. Alternatively, or in addition the expected diaphragm displacement of the loudspeaker 114 may be decreased by increasing the compression ratio of the audio processor 210. The audio processor 210 may be a full-band or a multi-band dynamic range controller. The audio processor 210 may have a side-chain input signal which may indicate an expected diaphragm displacement of the loudspeaker 114. The side-chain input signal may be generated by a linear or nonlinear loudspeaker model. The parameters which may be varied may include the gain value, which may for example vary between −12 dB to 6 dB, the threshold value of excursion for DRC processing, which may for example be 3 mm, and the compression ratio to be applied to an audio signal, which may for example be in the range of 1:1 to 10:1.

The controller 208 may also apply a perceptual weighting to the estimated distortion signal D2. This may be for example an A-weighting function whereby distortions at very high frequencies, for example above 10 kHz, are not relevant and also distortions at very low frequencies, for example less than 30 Hz, are not relevant. Alternatively if the distortion at a frequency will be masked by an undistorted frequency component, this may also be ignored if there is no perceived loss of audio quality.

Figure 4:
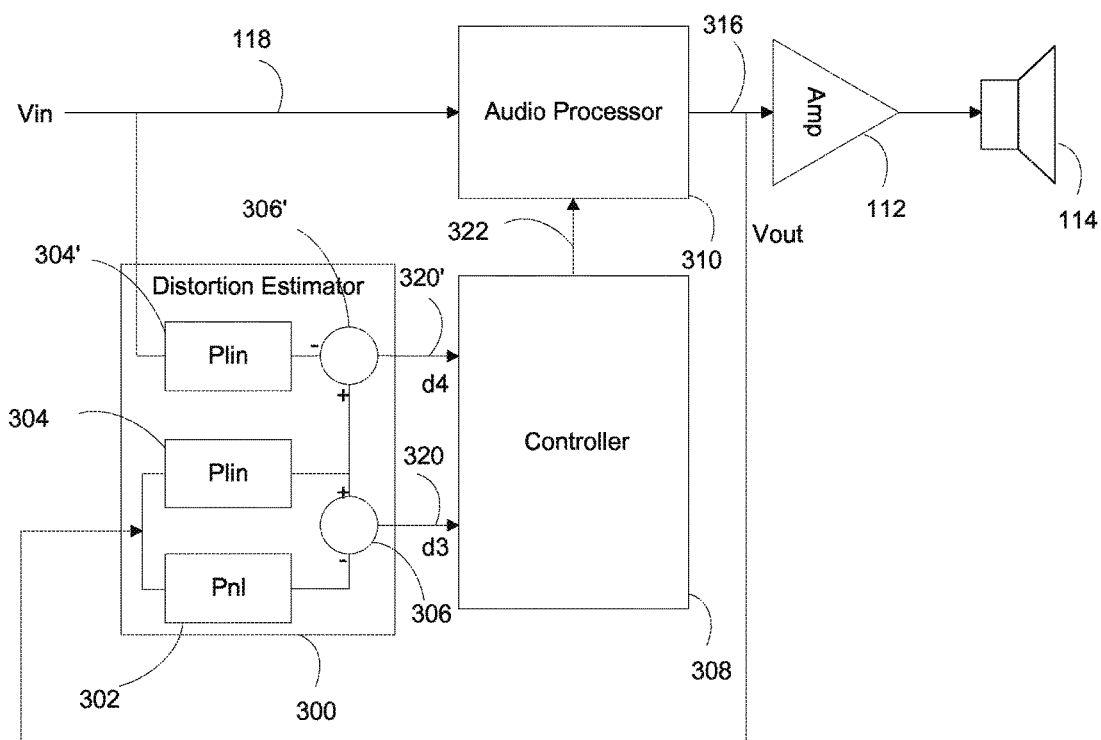
FIG. 4 illustrates an audio system with a feed-forward and feed-back control loop according to an embodiment.

FIG. 4 shows an audio system 3000 having a feedback and feed-forward control configuration. A distortion estimator 300 may have a nonlinear response estimator 302, a first linear response estimator 304, and a second linear response estimator 304'. The input of the nonlinear response estimator 302 may be connected to an audio processor output 316. The input of the first linear response estimator 304 may be connected to an audio processor output 316. The input of the second linear response estimator 304' may be connected to an audio input 118. The output of the nonlinear response estimator 302 may be connected to a first difference module 306. The output of the first linear response estimator 304 may be connected to the first difference module 306. The output 320 of the first difference module 306 may be connected to a first input of controller 308. The output of the first linear response estimator 304 may be connected to a second difference module 306'. The output of the second linear response estimator 304' may be connected to a second difference module 306'.

Controller output 322 may be connected to a control input of the audio processor 310. The audio processor 310 may be connected to the audio input 118. The audio processor output 316 may be connected to an amplifier 112 which may be an audio amplifier such as a class D amplifier. An output of the amplifier 112 may be connected to a loudspeaker 114. The audio processor 310 may be a dynamic range controller (DRC).

The audio system 3000 of FIG. 4 has a feed-back and feed-forward control mechanism and operates as follows. An input signal Vin on audio input 118 may be processed by audio processor 310. The audio processor 310 may generate an output signal Vout on audio processor output 316. The output signal Vout, which may be a digital signal, may also be routed to the distortion estimator 300. The distortion estimator 300 may include a linear response estimator 304 which may estimate a linear response of the amplifier 112 and a loudspeaker 114. The linear response estimator 304 may estimate linear response of an amplifier. The linear response estimator 304 may estimate a linear response of the loudspeaker 114 by the linear terms in a Volterra series, or from a parametric linear model of the loudspeaker behaviour. The output of the linear response estimator 304 may be a time varying signal that characterises the predicted output of the loudspeaker 114 as an expected diaphragm displacement. The output of the linear response estimator 304 may be a time varying signal that characterises the predicted output of the loudspeaker 114 as an expected acoustic output. The second linear response estimator 304' may estimate the linear response of the amplifier 112 in the same way as the first linear distortion estimator 304.

The distortion estimator 300 may estimate a non-linear response of the amplifier 112 and the loudspeaker and 114 to the audio output signal Vout. The non-linear response estimator 302 may estimate a non-linear response of an amplifier using a clipping amplifier model. The non-linear response estimator 302 may estimate a non-linear response of the loudspeaker 114 using a Volterra series having linear and nonlinear terms, or from a parametric non-linear model of the loudspeaker behaviour. The output of the non-linear response estimator 302 may be a signal that characterises the predicted output of the loudspeaker 114 as an expected diaphragm displacement. Alternatively or in addition, the output of the non-linear response estimator 302 may be a signal that characterises the predicted output of the loudspeaker 114 as an expected acoustical output.

The difference module 306 may determine a difference between the non-linear estimation output from the non-linear response estimator 302 and the linear estimation output from the linear response estimator 304. The output of the difference module 306 may be a time varying distortion signal D3 which represents an estimate of the amount of distortion in the amplifier 112 and the loudspeaker 114 caused by the output signal Vout.

The difference module 306' may determine a difference between the linear response estimation output from the first linear response estimator 304 and the linear response estimation output from the second linear response estimator 304'. The output of the second difference module 306' may be a time varying distortion signal D4 which represents an estimate of the amount of distortion caused by the processing performed by the audio processor 310 if reproduced by the amplifier 112 and the loudspeaker 114 in the absence of any additional non-linear behaviour of the amplifier 112 and the loudspeaker 114.

The controller 308 may vary one or more parameters dependent on the value of the time varying distortion signal D4 and D3. The controller 308 may include a computation of the temporally averaged signal energies of D4 and D3 and use these as estimations of the distortion contributions (E4 and E3).

The controller 308 may adapt the processing parameters in such a way that the expected distortion contribution of the audio processor 310 (E4) is equal in level to the expected distortion contribution of the amplifier 112 and the loudspeaker 114 (E3). If the distortion contribution of the processing (E4) is larger than that of the amplifier and loudspeaker (E3), the parameters of the audio processor 310 may be adapted such that the processing is less invasive, for example by increasing the DRC threshold. If the distortion contribution of the amplifier 112 and the loudspeaker 114 (E3) is larger than that of the audio processor 310 (E4), the controller 308 may adapt the parameters of the audio processor 310 such that the expected diaphragm displacement of the loudspeaker 114 is decreased, for example by decreasing the DRC threshold. If the distortion contribution of the amplifier/loudspeaker (E3) is very low, the control module may gradually disable the audio processor 310, for example by increasing the DRC threshold. The controller 308 may also apply a perceptual weighting to the estimated distortion signals D4 and D3. This may be for example an A-weighting function.

Figure 5:
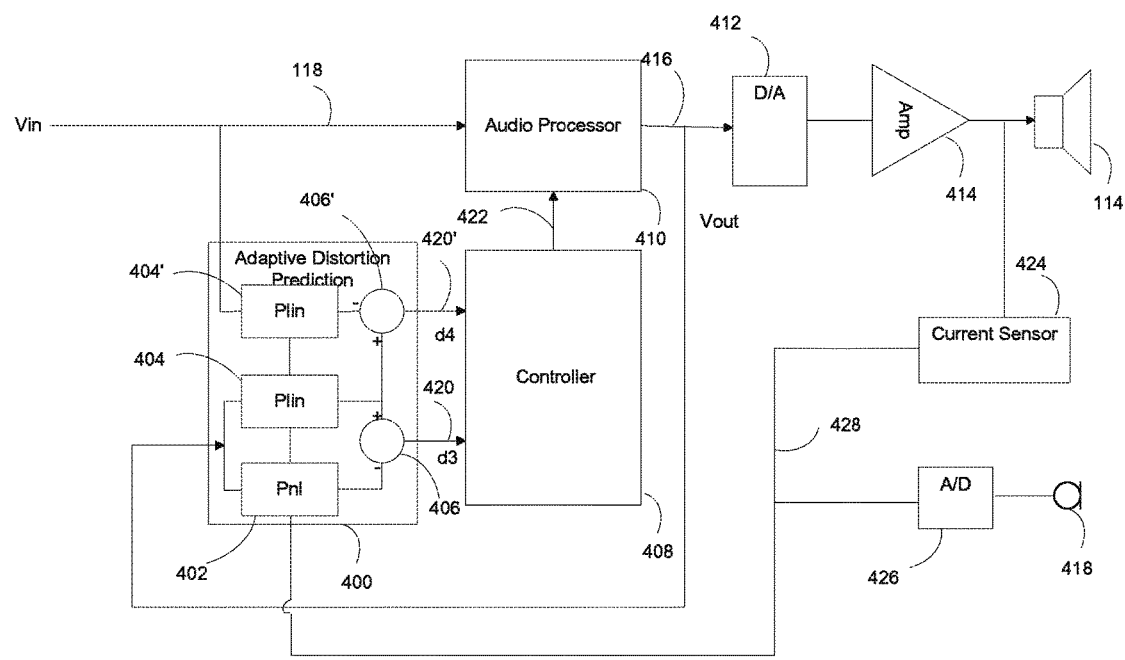
FIG. 5 illustrates an audio system with adaptive control according to an embodiment.

FIG. 5 shows an audio system 4000 having a feedback and feed-forward control configuration and adaptive distortion prediction. An adaptive distortion predictor 400 may have a nonlinear response estimator 402, a first linear response estimator 404, and a second linear response estimator 404'. The input of nonlinear response estimator 402 may be connected to an audio processor output 416. The input of linear response estimator 404 may be connected to an audio processor output 416. The input of linear response estimator 404' may be connected to an audio input 118. The output of nonlinear response estimator 402 may be connected to a first difference module 406. The output of the first linear response estimator 404 may be connected to the first difference module 406. The output 420 of the first difference module 406 may be connected to a first input of controller 408. The output of the first linear response estimator 404 may be connected to a second difference module 406'. The output of the second linear response estimator 404' may be connected to a second difference module 406'.

Controller output 422 may be connected to a control input of the audio processor 410. The audio processor 410 may be connected to the audio input 118. The audio processor output 416 may be connected to a digital to analog converter 412. The output of digital to analog converter 412 may be connected to amplifier 414 which may be an audio amplifier such as a class D amplifier. An output of the amplifier 414 may be connected to a loudspeaker 114. The loudspeaker 114 may be connected to an input of a current sensor 424. An output of the current sensor 424 may be connected to an input 428 of the adaptive distortion estimator 400 which may be a single connection or a bus connection. A microphone 418 may be connected to an analog to digital converter 426. The output of the analog to digital converter 426 may be connected to an input 428 of the adaptive distortion estimator 400 which may be a single connection or a bus connection.

The audio system 4000 of FIG. 5 has a feed-back and feed-forward control mechanism and operates as follows. An input signal Vin on audio input 118 may be processed by audio processor 410. The input signal Vin may be a digital signal. The audio processor 410 may be a dynamic range controller. The audio processor 410 may generate an output signal Vout on audio processor output 416. The output signal Vout, which may be a digital signal, may also be routed to the distortion estimator 400. The distortion estimator 400 may include a linear response estimator 404 which may estimate a linear response of the amplifier 414 and a loudspeaker 114. The linear response estimator 404 may estimate a linear response of the amplifier 414. The linear response estimator 404 may estimate a linear response of the loudspeaker 114 by the linear terms in a Volterra series, or from a parametric linear model of the loudspeaker behaviour. The output of the linear response estimator 404 may be a time varying signal that characterises the predicted output of the loudspeaker 114 as an expected diaphragm displacement. The output of the linear response estimator 404 may be a time varying signal that characterises the predicted output of the loudspeaker 114 as an expected acoustic output. The second linear response estimator 404' may estimate the linear response of the amplifier 414 in the same way as the first linear response estimator 404. The distortion estimator 400 may estimate a non-linear response of the amplifier 112 and the loudspeaker and 114 to the audio output signal Vout. The non-linear response estimator 402 may estimate a non-linear response of an amplifier using a clipping amplifier model. The non-linear response estimator 402 may estimate a non-linear response of the loudspeaker 114 using a Volterra series having linear and nonlinear terms, or from a parametric non-linear model of the loudspeaker behaviour. The output of the non-linear response estimator 402 may be a signal that characterises the predicted output of the loudspeaker 114 as an expected diaphragm displacement. Alternatively or in addition, the output of the non-linear response estimator 402 may be a signal that characterises the predicted output of the loudspeaker 114 as an expected acoustical output. The non-linear response estimator 402 may receive an input signal from either the microphone 418 or the current sensor 422 and adapt the estimation. The first linear response estimator 404 may receive an input signal from either the microphone 418 or the current sensor 422 and adapt the estimation. The first linear response estimator 404' may receive an input signal from either the microphone 418 or the current sensor 422 and adapt the estimation. The adaptation of the linear and non-linear model may be for example from the derivative of the squared difference between a predicted response and the actual response as determined by either the current sensor or the microphone. The skilled person will appreciate that other adaptation techniques may be used.

The difference module 406 may determine a difference between the non-linear response estimation output from the non-linear response estimator 402 and the linear response estimation output from the linear response estimator 404. The output of the difference module 406 may be a time varying distortion signal D5 which represents an estimate of the amount of distortion in the amplifier 112 and the loudspeaker 114 caused by the output signal Vout.

The difference module 406' may determine a difference between the linear response estimation output from the first linear response estimator 404 and the linear response estimation output from the second linear response estimator 404'. The output of the second difference module 406' may be a time varying distortion signal D4 which represents an estimate of the amount of distortion caused by the processing performed by the audio processor 410 if reproduced by the amplifier 112 and the loudspeaker 114 in the absence of any additional non-linear behaviour of the amplifier 112 and the loudspeaker 114.

The controller 408 may vary one or more parameters dependent on the value of the time varying distortion signals D3 and D4. The controller 408 may include a computation of the temporally averaged signal energies of D3 and D4 and use these as estimations of the distortion contributions, which may be denoted E3 and E4 respectively.

The controller 408 may adapt the processing parameters in such a way that the expected distortion contribution of the audio processor 410 (E3) is equal in level to that of the amplifier 112 and the loudspeaker 114 (E4). If the distortion contribution of the processing (E4) is larger than that of the amplifier and loudspeaker (E3), the parameters of the audio processor 410 may be adapted such that the processing is less invasive, for example by increasing the DRC threshold. If the distortion contribution of the amplifier 112 and the loudspeaker 114 (E4) is larger than that of the audio processor 410 (E3), the controller 408 may adapt the parameters of the audio processor 410 such that the expected diaphragm displacement of the loudspeaker 114 is decreased, for example decreasing the DRC threshold. If the distortion contribution of the amplifier/loudspeaker (E4) is very low, the control module should gradually disable the processing module by, for example, increasing the DRC threshold value.

The controller 408 may also apply a perceptual weighting to the estimated distortion signals D3 and D4.

Figure 6:
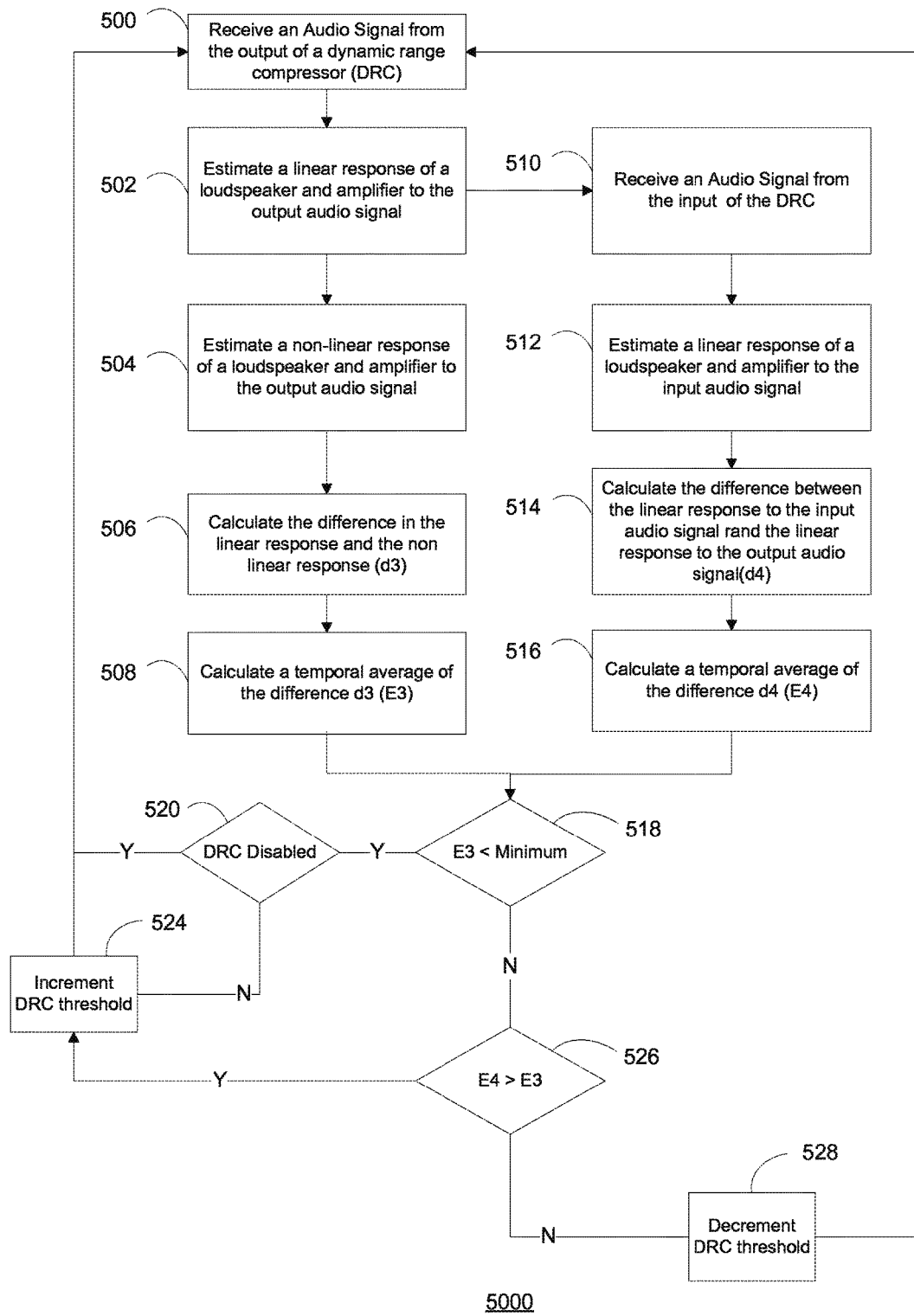
FIG. 6 illustrates a method of controlling an audio processor according to an embodiment.

FIG. 6 shows a method of controlling an audio signal 5000. This may be implemented by the controller 308 or the controller 408. In step 500 an audio signal may be received from the output of an audio processor which may be a dynamic range controller. In step 502 a linear response of loudspeaker and amplifier to the output audio signal may be estimated using a linear model of a least one of the loudspeaker and amplifier. From step 502, the method has two parallel branches. In the first branch in step 510 an audio signal is received on the input of an audio processor which may be a dynamic range controller. Step 510 is followed by step 512 whereby a linear response of the loudspeaker and amplifier is estimated to the input audio signal to the audio processor. In step 514 the difference is calculated between the linear response to the input audio signal and a linear response to the output audio signal. In step 516 temporal average of the difference between the linear response to the input audio signal and the linear response to the output audio signal is calculated which may be denoted as E4. In the second branch step 504 a non-linear response of loudspeaker and amplifier to the output audio signal is estimated. In 506 a difference between the linear response and the non-linear response is calculated. In step 508 a temporal average of the difference between the linear response and the non-linear response is calculated. This may be denoted as E3.

Following steps 508 and 516, a comparison is made in step 518 firstly between E3 and predetermined a minimum value. If E3 is less than a minimum threshold value then a check is made in step 520 to determine whether or not the audio processor which may be a dynamic range controller (DRC) has been disabled. If the DRC has been disabled then the method returns to the beginning at step 500. If the DRC has not been disabled, then the threshold value at which compression is applied may be increased in step 524. Returning to step 518, if E3 is greater than or equal to a minimum threshold value, then in step 526 a comparison is made between the value of E3 and the value of E4. If E4 is greater than E3 then the method step moves to 524 and the compression threshold may be incremented. If E4 is less than or equal to E3 then the compression threshold may be reduced by a predetermined amount in step 528. Following step 528 the method moves back to step 500 and the process repeats.

Embodiments described herein may be implemented in a combination of hardware and software running on a processor such as a digital signal processor (DSP).

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. An audio system comprising:
an audio processor for receiving an audio input signal and outputting an audio output signal;
an amplifier coupled to the audio processor;
a loudspeaker coupled to the amplifier;
a distortion estimator configured and arranged to determine an expected response of the amplifier and/or the loudspeaker to at least one of the audio input signal and the audio output signal;
a controller coupled to the distortion estimator and the audio processor;
wherein the distortion estimator is operable to generate a distortion prediction signal in dependence of a difference between an expected non-linear response of the loudspeaker and/or the amplifier and an expected linear response of the loudspeaker and/or the amplifier; and
wherein the controller is configured and arranged to vary the operating parameters of the audio processor in dependence of the generated distortion prediction signal.

2. The audio system of claim 1, wherein the operating parameters comprise at least one of a gain, a compression threshold and a compression ratio.

3. The audio system of claim 1, wherein the controller comprises a perceptual model and wherein the controller is operable to assign a lower weighting factor to frequency components of the distortion prediction signal that are of lower perceptual relevance.

4. The audio system of claim 3, wherein the perceptual model comprises an A-weighting model.

5. The audio system of claim 1, wherein the distortion estimator comprises a linear loudspeaker response estimator, a non-linear loudspeaker response estimator and a comparator coupled to the linear loudspeaker response estimator and the non-linear loudspeaker response estimator and wherein the comparator is operable to output a difference between the estimated linear loudspeaker response and the estimated non-linear loudspeaker response.

6. The audio system of claim 1, wherein the audio processor is configured to apply a time-varying gain to an audio signal and the controller is operable to determine a temporally averaged distortion prediction signal value and to vary the time-varying gain in dependence of the temporally averaged distortion prediction signal value.

7. The audio system of claim 1, wherein the audio processor comprises a multi-band processor and wherein the controller is operable to apply different gains to different frequency bands.

8. The audio system of claim 1, wherein the audio processor comprises a dynamic range controller.

9. The audio system of claim 1, further comprising a microphone coupled to the audio distortion estimator and wherein the audio distortion estimator is operable to adapt the expected response of at least one of the loudspeaker and the amplifier in response to an acoustic input.

10. The audio system of claim 1, further comprising a current sensor coupled to the loudspeaker and the distortion estimator and wherein the distortion estimator is operable to adapt the expected linear and non-linear response of the loudspeaker in dependence on the current flowing through the coil of the loudspeaker.

11. The audio system of claim 1, wherein the distortion estimator is configured to generate the distortion prediction signal in dependence of a difference between the expected non-linear response of the loudspeaker and the amplifier and the expected linear response of the loudspeaker and the amplifier; and wherein the controller is configured and arranged to vary the operating parameters of the audio processor in dependence of the generated distortion prediction signal.

12. The audio system of claim 1, wherein the distortion estimator is further configured and arranged to generate a further distortion prediction signal in dependence of a difference between the predicted linear response of the loudspeaker to the audio input signal and the predicted linear response of the loudspeaker to the audio output signal; and the controller is configured and arranged to vary the operating parameters of the audio processor in dependence of the generated distortion prediction signal and the further distortion prediction signal.

13. The audio system of claim 11, wherein the controller is further operable to determine a temporal average of the distortion prediction signal level and the further distortion prediction signal level and to vary the operating parameters of the audio processor in dependence of the temporal average of the distortion prediction signal level and the temporal average of the further distortion prediction signal level.

14. The audio system of claim 12, wherein the controller is configured and arranged to reduce the dynamic range threshold of the audio processor when the temporal average of the further distortion signal is greater than the temporal average of the distortion signal.

15. The audio system of claim 1, wherein the audio processor is configured to apply a domain transform to the audio input signal prior to processing the signal and to apply an inverse domain transform prior to outputting the audio signal.

* * * * *